(12) United States Patent
Stevenson et al.

(10) Patent No.: US 7,853,227 B2
(45) Date of Patent: Dec. 14, 2010

(54) AGC SYSTEM AND METHOD FOR BROADBAND TUNERS

(75) Inventors: Jan-Michael Stevenson, Frisco, TX (US); Jose L. Esquivel, Plano, TX (US); Carey Ritchey, Murphy, TX (US); Kim E. Beumer, Richardson, TX (US)

(73) Assignee: Microtune (Texas), L.P., Plano, TX (US)

( * ) Notice: Subject to any disclaimer, the term of this patent is extended or adjusted under 35 U.S.C. 154(b) by 728 days.

(21) Appl. No.: 11/441,816

(22) Filed: May 26, 2006

(65) Prior Publication Data
US 2007/0275686 A1    Nov. 29, 2007

(51) Int. Cl.
*H04B 1/06* (2006.01)
*H04B 7/00* (2006.01)

(52) U.S. Cl. .............. 455/232.1; 455/234.1; 455/249.1; 455/251.1; 375/345

(58) Field of Classification Search .................. 455/136, 455/138–139, 232.1–252.1; 375/317–319, 375/345
See application file for complete search history.

(56) References Cited

U.S. PATENT DOCUMENTS

| | | | |
|---|---|---|---|
| 4,050,055 A | 9/1977 | DiLeo | |
| 4,803,440 A | 2/1989 | Hotta et al. | |
| 4,837,530 A | 6/1989 | Kondoh | |
| 5,351,030 A * | 9/1994 | Kobayashi et al. | 338/295 |
| 5,710,991 A | 1/1998 | Lee | |
| 5,880,618 A * | 3/1999 | Koen | 327/351 |
| 5,912,599 A | 6/1999 | Beall | |
| 6,181,201 B1 | 1/2001 | Black | |
| 6,198,349 B1 * | 3/2001 | Kanno et al. | 330/282 |
| 6,300,814 B1 | 10/2001 | Takahashi | |
| 6,337,974 B1 | 1/2002 | Inamori et al. | |
| 6,498,927 B2 * | 12/2002 | Kang et al. | 455/245.2 |
| 6,625,433 B1 * | 9/2003 | Poirier et al. | 455/232.1 |
| 6,657,491 B2 * | 12/2003 | Fanous et al. | 330/124 R |
| 6,993,291 B2 * | 1/2006 | Parssinen et al. | 455/67.11 |
| 7,005,922 B2 * | 2/2006 | Oshima et al. | 330/278 |
| 7,098,738 B2 * | 8/2006 | Tam et al. | 330/284 |

(Continued)

FOREIGN PATENT DOCUMENTS

EP    0 969 595    1/2000

(Continued)

OTHER PUBLICATIONS

Partial International Search Report issued for PCT/US2007/069427; issued on Nov. 28, 2007; 4 pages.

(Continued)

*Primary Examiner*—Simon D Nguyen
(74) *Attorney, Agent, or Firm*—Fulbright & Jaworski L.L.P.

(57) ABSTRACT

A system for providing automatic gain control (AGC) comprises a signal path with an RF input, a plurality of power detectors in communication with the signal path, each of the power detectors operable to measure a total broadband power level of a signal in the signal path, each of the power detectors positioned to monitor a point in the signal path corresponding to a change in signal bandwidth, a control system operable to receive from each of the power detectors information associated with the power level and to adjust attenuation in the signal path in response to the information to achieve desired gain control.

21 Claims, 6 Drawing Sheets

U.S. PATENT DOCUMENTS

| | | | |
|---|---|---|---|
| 7,212,798 B1 * | 5/2007 | Adams et al. | 455/251.1 |
| 7,221,207 B2 | 5/2007 | Fukumoto et al. | |
| 7,253,700 B1 | 8/2007 | Chiu | |
| 7,257,382 B2 * | 8/2007 | Arai et al. | 455/91 |
| 7,265,604 B2 | 9/2007 | Yasuda et al. | |
| 7,355,476 B2 * | 4/2008 | Kasha et al. | 330/284 |
| 7,408,411 B2 * | 8/2008 | Kim et al. | 330/284 |
| 7,440,738 B2 * | 10/2008 | Zhang et al. | 455/234.1 |
| 2005/0118971 A1 | 6/2005 | Arai et al. | |
| 2005/0179820 A1 | 8/2005 | Ina et al. | |
| 2006/0128334 A1 * | 6/2006 | Ikuta et al. | 455/232.1 |
| 2007/0082639 A1 * | 4/2007 | Lindstrom et al. | 455/226.3 |

FOREIGN PATENT DOCUMENTS

| | | |
|---|---|---|
| GB | 2 398 943 | 9/2004 |
| WO | WO-01/13513 | 2/2001 |
| WO | WO-01/93437 | 12/2001 |
| WO | WO-2004/077492 | 9/2004 |

OTHER PUBLICATIONS

Office Action and Partial International Search Report issued for international application No. PCT/US2007/069423 dated Feb. 4, 2008, 8 pages.

Office Action from U.S. Appl. No. 11/442,643 dated Aug. 27, 2007, 9 pgs.

Office Action from U.S. Appl. No. 11/442,643 dated Jan. 16, 2008, 12 pgs.

Office Action from U.S. Appl. No. 11/442,643 dated Jun. 26, 2008, 10 pgs.

Office Action from U.S. Appl. No. 11/442,643 dated Apr. 11, 2008, 4 pgs.

Office Action from U.S. Appl. No. 11/442,643 dated Sep. 8, 2008, 6 pgs.

* cited by examiner

INPUTS: $H_1$ = TRUE IF PD1out>$V_H$. THE SAME APPLIES TO $MH_1$, $M_1$, $ML_1$, AND $L_1$
$H_2$ = TRUE IF PD2out>$V_H$. THE SAME APPLIES TO $MH_2$, $M_2$, $ML_2$, AND $L_2$
RollA$_1$ = TRUE IF THE NEXT CLOCK CYCLE WILL CAUSE THE ATTENUATOR U/D COUNTER TO ROLL OVER IN EITHER DIRECTION BASED ON PD1
RollR$_1$ = TRUE IF THE NEXT CLOCK CYCLE WILL CAUSE THE Rload U/D COUNTER TO ROLL OVER IN EITHER DIRECTION BASED ON PD1
RollA$_2$ = TRUE IF THE NEXT CLOCK CYCLE WILL CAUSE THE ATTENUATOR U/D COUNTER TO ROLL OVER IN EITHER DIRECTION BASED ON PD2
RollR$_2$ = TRUE IF THE NEXT CLOCK CYCLE WILL CAUSE THE Rload U/D COUNTER TO ROLL OVER IN EITHER DIRECTION BASED ON PD2
RollDNC = TRUE IF THE NEXT CLOCK CYCLE WILL CAUSE THE DNC U/D COUNTER TO ROLL OVER IN EITHER DIRECTION
gcRLeqTOP$_1$ = TRUE IF Rload U/D COUNTER VALUE IS EQUAL TO PROGRAMMED TOP$_1$ (FROM SERIAL INTERFACE)
gcDNCltTOP$_2$ = TRUE IF DNC U/D COUNTER VALUE IS LESS THAN PROGRAMMED TOP$_2$ (FROM SERIAL INTERFACE)
GOOD$_1$ = TRUE IF $V_{ML}$<PD1out<$V_{MH}$, OR $ML_1 \cdot \overline{MH_1}$
GOOD$_2$ = TRUE IF $V_{ML}$<PD2out<$V_{MH}$, OR $ML_2 \cdot \overline{MH_2}$ OUTPUTS: onRload = ENABLE Rload U/D COUNTER IF TRUE
onAtten = ENABLE ATTENUATOR U/D COUNTER IF TRUE
onDNC = ENABLE DNC U/D COUNTER TRUE
MODE = COUNT UP IF TRUE, COUNT DOWN IF NOT TRUE
AGCon = ENABLE CLOCK IF TRUE, DISABLE IF NOT TRUE

AGC SYSTEM AND METHOD FOR BROADBAND TUNERS

CROSS-REFERENCE TO RELATED APPLICATIONS

The present application is related to co-pending and commonly-assigned U.S. patent application Ser. No. 11/442,643, filed concurrently herewith, entitled, "DIGITAL ATTENUATOR CIRCUITS AND METHODS FOR USE THEREOF," the disclosure of which is hereby incorporated herein by reference.

TECHNICAL FIELD

The present invention relates, in general, to Automatic Gain Control (AGC) in a system with an RF signal input and, more particularly, to AGC for broadband tuners.

BACKGROUND OF THE INVENTION

Currently, most television (TV) tuners employ narrow tracking filters near the their signal inputs which are used to diminish, or at least significantly limit, undesired portions of signals. Such filters generally are approximately 20 MHz bandpass filters and adjustable to pass a signal of interest. Placement of the filters near a signal input allows for a significant number of unwanted bands to be substantially removed before the signal reaches a demodulator as a narrow band signal. A narrow-band power measurement device at the baseband input to the demodulator is then used to provide Automatic Gain Control (AGC) by measuring the narrow band signal power and adjusting gain (usually at the signal input). The demodulator is usually located near the output of the signal path. While it might seem at first that detecting signal power near the output would allow signal power levels closer to the input to fluctuate without adequate control, the use of the narrow tracking filters can help to reduce power in a significant portion of the spectrum before the signal reaches amplifiers and other circuitry that are prone to distortion.

A disadvantage of narrow tracking filters is that they are not easily accommodated on semiconductor chips. In fact, with current technology, prior art systems have yet to implement narrow tracking filters on silicon because of the large inductors required in narrow tracking filter designs. Prior art systems that perform AGC by measuring narrow-band power near the output suffer from input power problems when narrow tracking filters are not present. For example, an RF signal input may include information on many channels, and the demodulator focuses on only one of those channels at a time. Thus, the narrow-band power measurement device adjusts the gain according to the measured power of whichever signal the demodulator is locked on to. However, the narrow-band power measurement device will not detect the power in the other channels. In other words, the AGC loop bases its determination on output power in the narrow band of interest but does not account for the full power spectrum of the input signal. As a result, high-power signals in those undesired channels are not controlled and can cause distortion in circuits that are close to the input, such as amplifiers.

One solution has been to implement narrow tracking filters separate from other parts of a tuner that are on a silicon chip. However, implementing large parts of a chip tuner off-chip can be expensive and defeats the purpose of integration. Further, implementing the narrow filters off-chip generally fails to provide an acceptable broadband input return loss, making such designs undesirable for cable applications. Currently, the prior art offers no substitute for narrow tracking filters. As a result, integration of tuner systems on chips has been impeded.

The AGC systems described above generally use analog attenuators to control the gain. Analog attenuators usually provide a continuous range of attenuation, and, therefore, a system can usually achieve a continuous range of signal power levels. A control system can then settle the signal power level at or very near a single reference power level. Engineers have been reluctant to try digital attenuators due to concern that discrete levels of attenuation offered by such attenuators would not allow a control system to settle, since there would be a small amount of error in a detected signal power level versus a reference signal power level. Accordingly, prior art AGC systems lack digitally-controlled attenuation.

BRIEF SUMMARY OF THE INVENTION

The present invention is directed to systems and methods which provide AGC with respect to tuners having broadband input. In one example system, a plurality of broadband power detectors are placed in the signal path at points that correspond to changes in bandwidth of the signal, for example, after filters. The broadband power detectors are capable of detecting the total power for the signal at their respective points from desired and undesired signals. Further, an embodiment of the system includes a plurality of attenuators that are distributed throughout the signal path. The measurements from the broadband power detectors are sent to a central control system that determines if attenuation should be adjusted. When the control system adjusts attenuation, it increases or decreases attenuation at one or more of the distributed attenuators.

In one example embodiment, the attenuators are digital attenuators that provide discrete levels of attenuation in the signal path. The central control system then compares signal power at each power detector to one or more ranges ("windows") of power levels and attempts to bring the signal power within the windows. Thus, the control system can settle in a more stable manner than if signal power was compared to a single reference power level.

One example embodiment includes a state machine that measures signal power at one broadband power detector at a time and attempts to settle the measured power. After the power measured by the first broadband power detector is settled in a defined power window, the state machine moves to the next broadband power detector and attempts to settle the power detected thereby.

Various embodiments use one or more techniques to distribute attenuation in the signal path. In addition to placing attenuators throughout the signal path, some embodiments increase or decrease attenuation to a specified level in one attenuator and then move to the next attenuator, where such embodiments continue to increase or decrease attenuation to a specified level before moving once again to another attenuator. Such embodiments then cycle back to the first attenuator, if desired, to further increase or decrease attenuation. Such embodiments distribute attenuation changes throughout the signal path during gain control operations. Distribution of attenuation may help to ensure that signal power is not left uncontrolled at various parts of the signal path.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
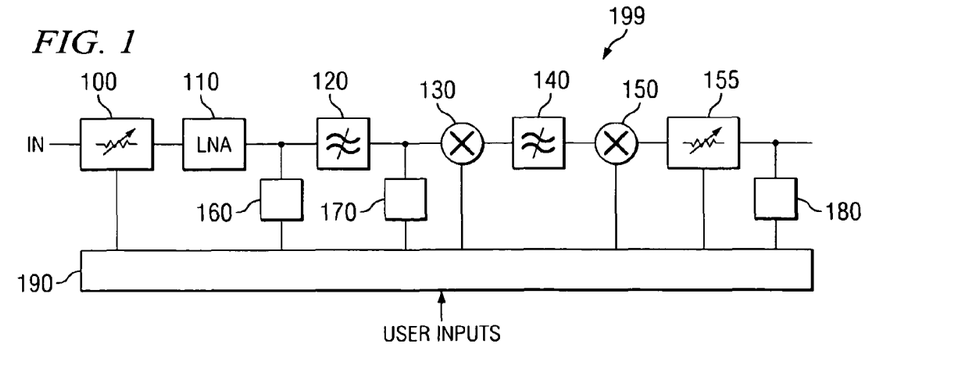
FIG. 1 is an illustration of an exemplary system adapted according to one embodiment of the invention.

FIG. 1 is an illustration of exemplary system 199 adapted according to one embodiment of the invention. System 199 is a Radio Frequency (RF) tuner with Automatic Gain Control (AGC). In some embodiments, some or all of the components of system 199 may be disposed on a same semiconductor chip. However, in other embodiments, various components, including filter 140, may be off-chip. Single-chip systems, multi-chip systems, and non-chip systems are within the scope of the invention.

The signal path includes front-end attenuator 100 that receives an RF input signal, low-noise amplifier (LNA) 110, filter 120, up conversion mixer 130, filter 140, down conversion mixer 150, and digital attenuator 155. Although not shown in these figures, the signal path continues on to other components, such as amplifiers, filters, and one or more demodulators or other baseband processing circuits. The invention is not limited to the particular components shown in FIG. 1, as a signal path with AGC can be implemented in a variety of configurations.

A plurality of broadband power detectors 160, 170, 180 are in communication with the signal path at various points. As used herein, "broadband" refers to a signal that includes one or more channels in addition to any channels that are processed by a demodulator or other baseband processing circuit at a given time, without regard to residual power from channels that have been substantially filtered out. For example, in a TV tuner that has a single-channel demodulator, a broadband signal includes two or more TV channels. Power detector 160 is placed after LNA 110 (LNA 110 includes filter circuitry, not shown), power detector 170 is placed after filter 120, and power detector 3 is placed after mixer 150 and filter 140. The placement of each of power detectors 160, 170, 180 of the illustrated embodiment is at a point that corresponds to a bandwidth change of the signal, and each of power detectors 160, 170, 180 measures the total power in the signal at each respective placement point. Thus, while LNA 110 will change the power and frequency make-up of the RF signal, power detector 160 measures the total power of the RF signal at its respective point in the signal path. The same is true for detectors 170 and 180.

System 199 also includes control block 190. Control block 190 receives measured power levels from detectors 160, 170, 180 and controls the attenuation by adjusting digital attenuators 100 and/or 150. Control block 190 can be analog or digital. Control block 190, in this example, includes user inputs, allowing a user to specify, for example, optimal power levels at points in the signal path or takeover points for attenuators 100 and 150 (explained in mode detail below).

Figure 2:
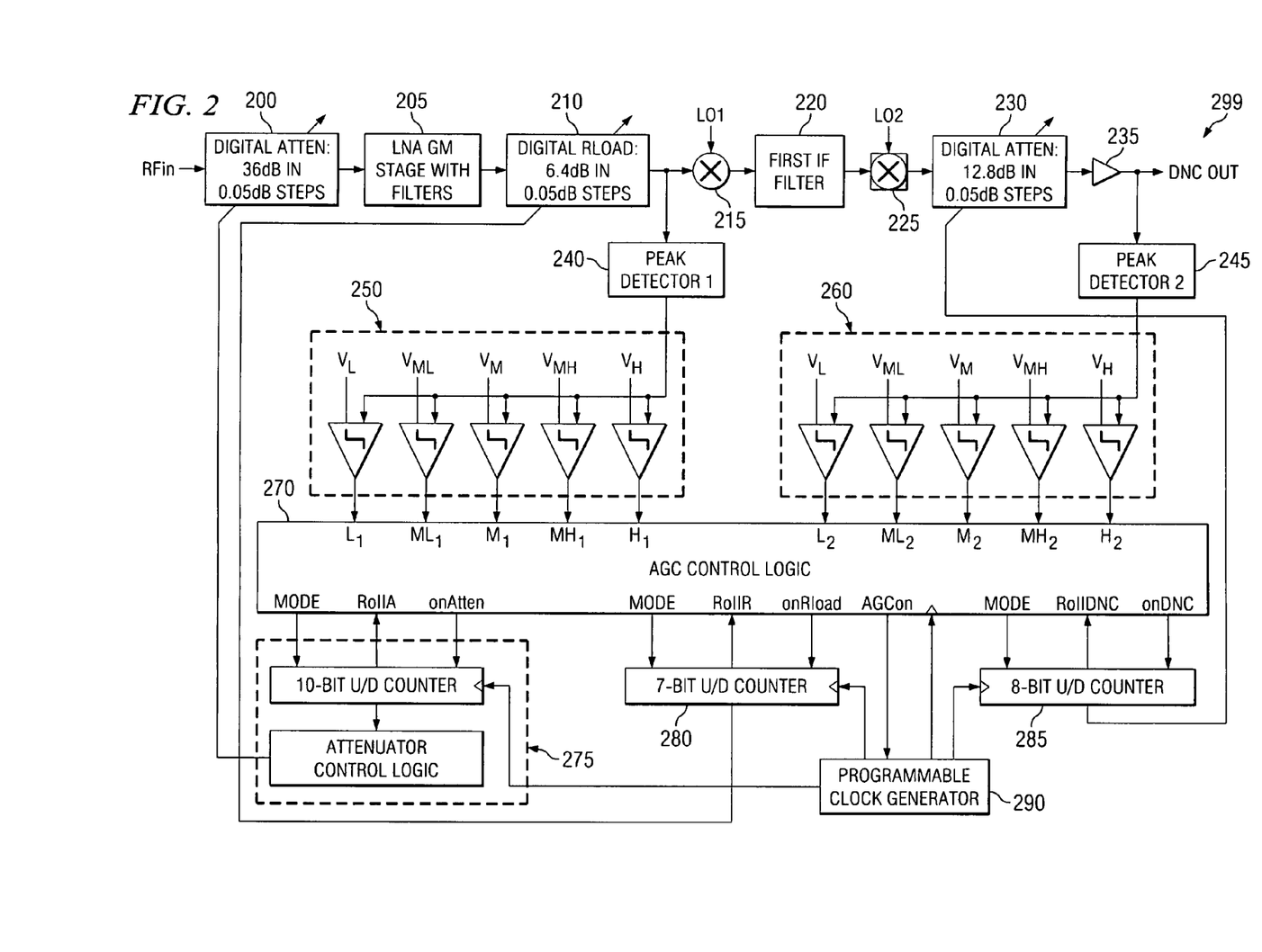
FIG. 2 is an illustration of an exemplary system adapted according to one embodiment of the invention for providing AGC in a RF tuner.

FIG. 2 is an illustration of exemplary system 299 adapted according to on embodiment of the invention for providing AGC in a RF tuner. FIG. 2 adds detail to the embodiment shown in FIG. 1. In this example, the illustrated parts of system 299 are all disposed in a single semiconductor chip, except for filter 220. However, as mentioned above, various embodiments of the invention are not limited to being single-chip, multi-chip, partly-chip, or non-chip. In alternative embodiment, filter 220 may also be placed the same chip as the other components.

At the top of system 299 is shown the signal path that includes, beginning at RF input, digital attenuator 200. Attenuator 200 provides a maximum of 36 dB attenuation in approximately 0.05 dB steps. The signal path also includes LNA 205, which has bandpass filtering, thereby amplifying the signal and changing its bandwidth. Digital attenuator 210 follows LNA 205, and it provides 6.4 dB of attenuation at 0.05 dB steps. Up-conversion mixer 215 receives the signal from attenuator 210, mixes the signal, and sends the signal off-chip to Intermediate Frequency (IF) filter 220. The signal then returns to the chip where it is fed to image-reject down-conversion mixer 225. Digital attenuator 230 provides a maximum of 12.8 dB attenuation at 0.05 dB steps, which is followed by fixed gain amplifier 235 to the output.

System 299 includes two broadband peak detectors (i.e., a type of power detector—it should be understood that various embodiments can employ other kinds of power detectors, such as Root Mean Square power detectors and the like alternatively to or in addition to peak detectors) 240 and 245. Each peak detector 240 and 245 is in communication with the signal path in a point that corresponds to a change in signal bandwidth. For instance, peak detector 240 is placed after LNA 205, which includes bandpass filtering; thus the bandwidth of the signal is changed by LNA 205 before it is detected by peak detector 240. Also, peak detector 245 is placed after filter 200. The output of each peak detector 240 and 245 is a voltage signal that is proportional to the power detected.

The output of peak detector 240 is fed to comparators 250, which compare the output of peak detector 240 to a plurality of levels, here five separate voltage levels. Similarly, the output of peak detector 245 is fed to comparators 260, which compare the output of peak detector 245 to a plurality of levels, here five voltages, which may be the same or different from the voltages compared to the output of detector 240.

System 299 also includes control logic block 270, which controls the attenuation in the signal path through use of counter circuits 275, 280, and 285, as explained in more detail below. Digital words output from counter circuit 275 control attenuator 200. Words output from counter 280 control attenuator 210, and words from counter 285 control attenuator 230. Each of counter circuits 275, 280, and 285 are driven by programmable clock generator 290.

Since attenuators 200, 210, and 230 are digital, they each provide attenuation in discrete steps rather than in a continuous range. Accordingly, a control system that simply compares signal power to a single reference value may have trouble settling, since discrete attenuation will rarely (if ever) cause the signal power to be the same as the reference value. By contrast, system 299 uses each comparators 250 and 260 to determine if the voltage signals output by detectors 240 and 245 fall into one or more respective windows defined by VL, VML, VM, VMH, and/or VH. In one example, attenuation is adjusted so that the output from each detector 240 and 245 falls within the window defined by VML and VMH. In another example, attenuation is adjusted so that the output from each detector 240 and 245 falls within the window defined by VL and VH. Wider power windows tend to reduce the amount the adjusting that occurs; however, they also tend to provide less precise gain control. In each such example, once the power level from one or both of detectors 240 and 245 is within an acceptable defined range, attenuation changes may be discontinued until the power level either decreases or increases to the extent that it leaves the window.

Figure 3:
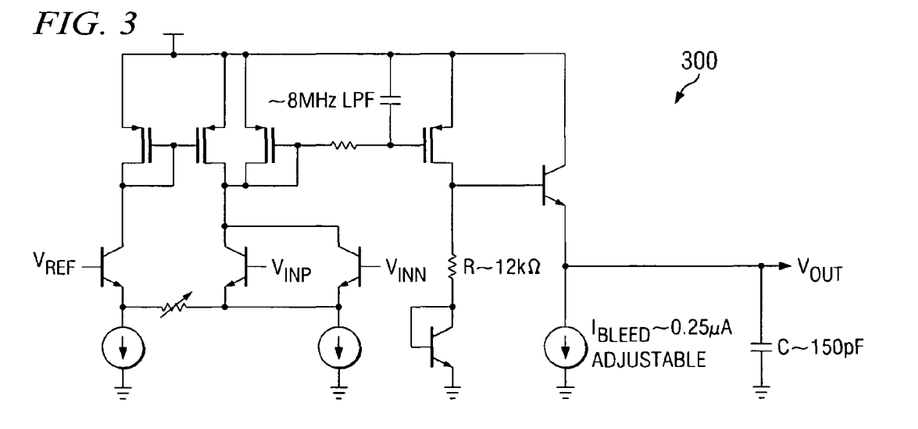
FIG. 3 is an illustration of an exemplary peak detector adapted according to one embodiment of the invention.

FIG. 3 is an illustration of exemplary peak detector 300 adapted according to one embodiment of the invention. In this example, signal power is sensed at $V_{inn}$ and $V_{inp}$. $V_{out}$ is sent to comparators, and it is proportional to the total broadband signal power that it senses at its associated point in the signal path. The range of power that is detected by peak detector 300 can be based, in part, on how large the power windows are. For instance, if a power window of interest is 8 dB, peak detector 300 may be designed to accurately measure in a 10 dB range. In one example, the optimum power level for a signal at a point sensed by detector 300 is known, or at least approximately known based upon based upon some considerations. For example, optimum power level for a signal at a given point may be based upon a power level that is within a linear operating range of a subsequent circuit element The voltage output by peak detector at the optimum power is then defined in the system as VM. The corresponding comparators may then be programmed accordingly to set VM and applicable windows.

Figure 4:
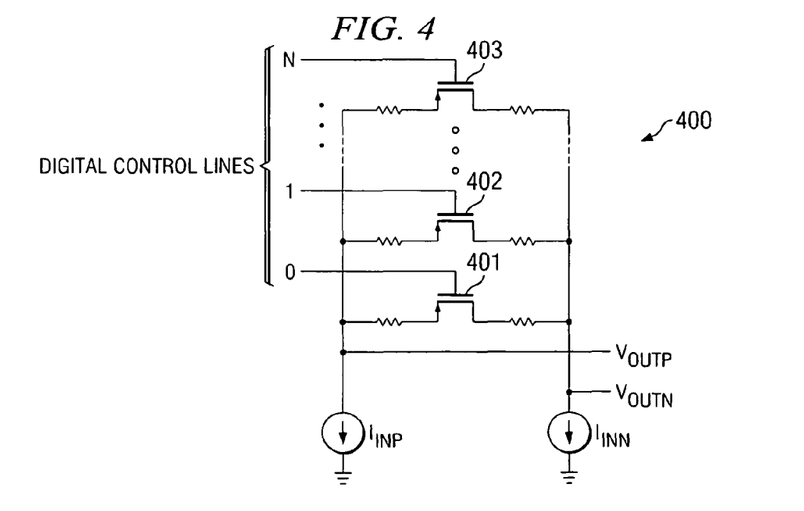
FIG. 4 is an illustration of an exemplary digital attenuator.

FIG. 4 is an illustration of an exemplary digital attenuator 400. The attenuation provided by attenuator 400 is a function of its resistance. The resistance is a function of the number of discrete, resistive legs 401-403 that are switched "on" at a given time. The switching of resistive legs 401-403 is controlled by digital control lines. In this example, the digital control lines are in communication with a counter (e.g., counter 275 of FIG. 2), and each digital control line corresponds to one bit of the word output from the counter. This is an example technique that employs counters to control an attenuation circuit. Other examples of appropriate digital attenuator circuits may be found in U.S. patent application Ser. No. 11/442,643, filed concurrently herewith, entitled, "DIGITAL ATTENUATOR CIRCUITS AND METHODS FOR USE THEREOF."

The embodiments illustrated in FIGS. 1, 2, 3, and 4 are merely examples, and other ways of arranging a tuner according to the invention are possible. For instance, different ranges for attenuators, different types of attenuators, different signal path configurations, different power windows, different broadband power detectors, and the like are all possible.

In fact, principles of the invention are applicable in general to broadband tuners and are not limited to any specific design.

Figure 5A:
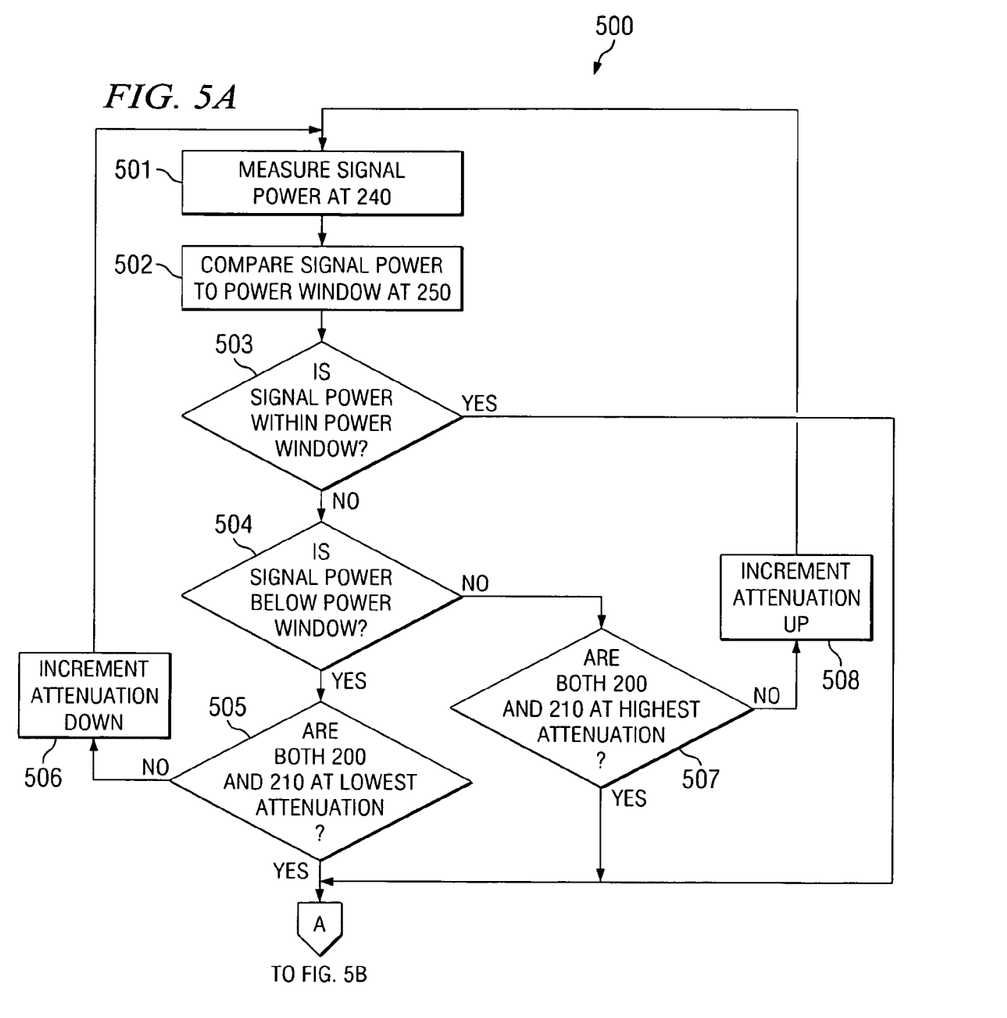
FIGS. 5A-5B are an illustration of an exemplary method for providing AGC in the system of FIG. 2.
Figure 5B:
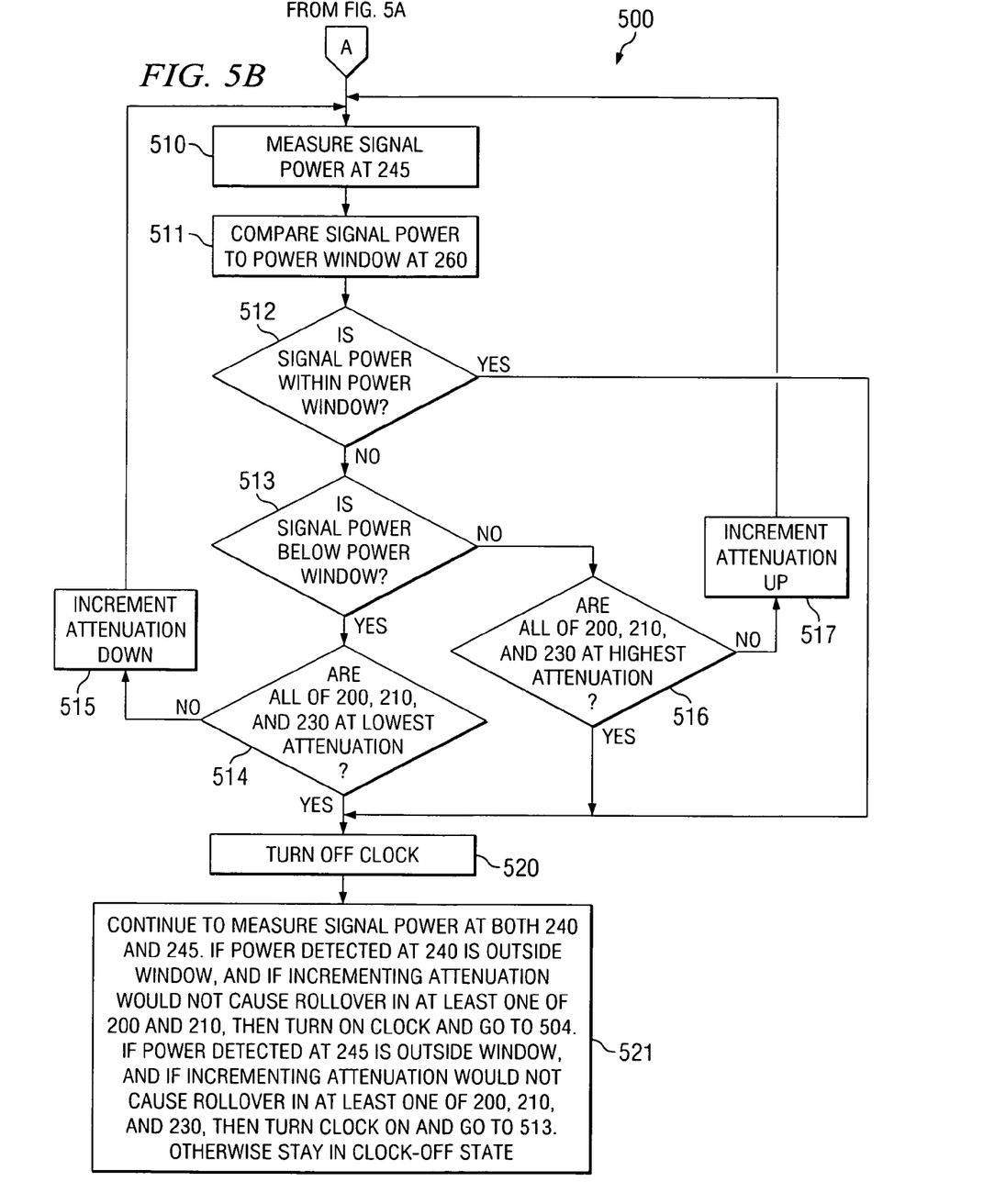

FIGS. 5A-5B are an illustration of exemplary method 500 for providing AGC in system 299 (FIG. 2). Method 500 is merely exemplary, as other system designs may use different methods for operation. Additionally, other methods for operation may be used in system 299.

The basic flow of method 500 is one that first settles the power measured by peak detector 240 in a power window, then settles peak detector 245. Once the power levels measured by both of peak detectors 240 and 245 are settled, the method moves to a rest state where signal power is detected and compared to power windows, but no adjustments are made to attenuation. The method may also advance to the rest state if all of the attenuators are at a maximum or a minimum and no change to attenuation is possible at the given signal level. The method moves from the rest state if the signal power level is outside of a power window for a given peak detector 204 or 245 and it is possible to change the attenuation.

Steps 501-508 operate generally to cause the power detected by peak detector 240 to settle in a power window defined by VML and VMH. In step 501, total signal power is measured at peak detector 240. Peak detector 240 outputs a voltage signal that is indicative of the power level. In step 502, the signal power level is compared to one or more power windows at comparators 250. In this example, the output voltage signal is compared to a voltage window defined by VML and VMH. A step 503, a determination is made if the signal power is within the window. If it is, method 500 then advances to an operation that settles the power detected by peak detector 245. If the signal power level is not within the power window, then it is determined if the power is below the power window (i.e., below VML) at step 504. If the power level is below the power window, then it is determined whether attenuators 200 and 210 are at the lowest attenuation possible at step 505. If attenuators 200 and 210 are at the lowest attenuation possible, then method 500 advances to an operation that settles the power detected by peak detector 245. If it is still possible to adjust attenuation down, then attenuation is incremented down in step 506.

System 299, in this example, increments attenuation in a specific way. Each attenuator 200, 210, and 230 is controlled by AGC control logic 270 that causes counters 275, 280, 285 to output digital words to respective attenuators 200, 210, and 230, thereby adjusting the attenuation of each. AGC control logic takes action based on the signal power level comparison (step 502) at time periods based on the frequency of clock 290. The time periods allow for the signal to "settle out" before subsequent adjustments are performed.

Further, as a result of the comparing, AGC control logic 270 causes one of counters 275 or 280 to count up a single step or down a single binary step, and only one counter is adjusted at a time. In this example, a counter value of ten zeroes at counter 275 causes the lowest level of attenuation for attenuator 200, and a value of ten ones represents the highest level of attenuation. When it is determined by AGC control logic 270 that the detected power is below the power window, then AGC control logic 270 outputs a mode that specifies that the next counter adjustment should be down. The appropriate counter 275 or 280 is then adjusted at the next clock cycle.

Attenuation is distributed in system 299 in order to even out signal levels in the signal path so as to avoid large power level differences between the front end and back end of the signal path. In this example, when attenuation is incremented down (step 506), attenuator 200 is incremented first. This may be repeated until attenuator 200 reaches its bottom rollover point (i.e., counter 275 is at all zeros), when AGC control logic 270 begins incrementing attenuator 210 down. Method 500 returns to step 501 after each incrementation.

Returning to step 504, if it determined that the signal power is not below the power window (i.e., it is above VMH), method 500 progresses to step 507, where it checks whether both of attenuators 200 and 210 are at highest attenuation (i.e., counters 275 and 280 are at high rollover—all ones). If both attenuators 200 and 210 are at high rollover, then method 500 advances to an operation that settles the signal power detected by detector 245 in a window. If attenuators 200 and 210 are not at high rollover, then attenuation is incremented up in step 508.

Incrementing attenuation up is performed, in this example, in a specific way. Similar to the operation described above, attenuation is adjusted by incrementing counters 275 and 280 one at a time and at clock cycles. In step 508, when incrementing attenuation up, AGC control logic 270 increases the attenuation of attenuator 210 first. Once attenuator 210 reaches a takeover point, then AGC control logic 270 begins increasing the attenuation of attenuator 200. Takeover points can be defined by values of counters 275, 280, and 285. In this example, a takeover point of attenuator 210 can be set to be a value between all zeros of counter 280 and all ones, for instance, the base-ten value sixty-three. AGC control logic 270 increments attenuator 210 until a takeover point is reached. Then, AGC control logic 270 begins to increase the attenuation of attenuator 200. In this example, attenuator 200 has no takeover point for simplicity. Once the high rollover point of attenuator 200 is reached, then AGC control logic 270 begins increasing the attenuation of attenuator 210 once more. In this manner AGC control logic 270 increments attenuator 210 up to at least a portion of its maximum value, adjusts attenuator 200 up until it reaches the maximum attenuation of attenuator 200, then once again increase the attenuation of attenuator 210 (if need be) until its maximum attenuation value is reached. Method 500 returns to step 501 after each incrementation. The use of takeover points helps to increase the distribution of attenuation throughout the signal path.

Once the signal power level measured by peak detector 240 is settled in a power window (or if both of attenuators 200 and 210 are at rollover points and no more adjustment is possible), method 500 moves to an operation wherein the signal power level detected by peak detector 245 is settled. At step 510, the signal power level is measured at peak detector 245. The power level is compared to a power window by comparators 260.

If it is determined in step 512 that the signal power level is within the window, then method 500 moves to a rest state to be described further below. The window may be the same or different than that described above with regard to peak detector 240. In this example, for simplicity, the power window is defined by VML and VMH. If it is determined that the signal power level is outside of the power window, then method 500 moves to step 513 where it is determined if the signal power level is below the power window.

If the power level detected by peak detector 245 is below the power window, then it is determined whether all of attenuators 200, 210, and 230 are at their lowest attenuations. If all of attenuators 200, 210, and 230 are at low rollover, then method 500 moves to the rest state. If one or more of attenuators 200, 210, and 230 can be adjusted down, then attenuation is incremented down in step 515.

Incrementing down in step 515 is performed in a specific way, in this example. As described above, only one attenuator 200, 210, and 230 is adjusted at a time at single binary steps, and adjustments are performed at clock cycles of clock 290. In response to power levels detected at peak detector 245, AGC control logic 270 adjusts attenuator 200 down first, then adjusts attenuator 210 down if and when attenuator 200 reaches its low rollover point. AGC control logic 270 then adjusts attenuator 230 once attenuator 210 reaches its minimum. Method 500 returns to step 510 after each binary incrementation.

Returning to step 513, if it is determined that the signal power level is not below the power window (i.e., it is above VMH), then it is determined whether all of attenuators 200, 210, and 230 are at their maximum values in step 516. If each attenuator 200, 210 and 230 is at its high rollover point, then method 500 moves to a rest state. If the attenuation of one or more of attenuators 200, 210, and 230 can be increased, then attenuation is incremented up in step 517.

Incrementing attenuation up is performed in a specific way in this example. As described above, only one attenuator 200, 210, and 230 is adjusted at a time at single binary steps, and adjustments are performed at clock cycles of clock 290. Both of attenuators 210 and 230 have takeover points. In response to power levels detected at peak detector 245, AGC control logic 270 adjusts attenuator 230 up first, then adjusts attenuator 210 up if and when attenuator 230 reaches its low rollover point or a takeover point. AGC control logic 270 adjusts attenuator 200 up if and when attenuator 210 reaches its high rollover point or a takeover point. AGC control logic 270 then increases the attenuation of attenuator 230 once again if attenuator 200 reaches its maximum. Accordingly, AGC control logic 270 increases the attenuation of attenuator 210 once again if and when attenuator 230 reaches its maximum or another takeover point. In this manner, incrementing attenuation up is performed at least partly at attenuator 230, then at attenuator 210, then at attenuator 200, and it returns to adjusting attenuator 230 up. As mentioned above, using takeover points helps to distribute attenuation throughout the signal path. Method 500 returns to step 510 after each binary incrementation.

In the example above, the use of takeover points was described only with regard to increasing attenuation; however, various embodiments of the invention are not so limited. For instance, when adjusting attenuation down, AGC control logic 270 can switch to decreasing the attenuation of attenuator 230 when the takeover point of attenuator 210 has been reached through incrementally decreasing attenuation. Further, each of attenuators 200, 210, and 230 may have one or more takeover points, so that a given attenuator is not necessarily limited to having one or zero takeover points. Takeover points may be set in a number of ways. For instance, takeover points may be hardwired in logic of AGC control logic 270, calculated by AGC control logic 270 according to an algorithm, determined by user input into AGC control logic 270, or the like.

Once the signal power level measured by peak detector 245 is settled in a power window (or if all of attenuators 200, 210, and 230 are at rollover points and no more adjustment is possible), method 500 moves to a rest state. At step 520, clock 290 is stopped, though measuring of the signal power levels at peak detectors 240 and 245 continues. Step 521 defines when method 500 leaves the rest state. If method 500 is in the rest state as a result of power levels at both peak detectors 240 and 245 being settled in power windows, then method 500 will turn clock 290 on and return to step 504 if the power level detected at peak detector 240 leaves the power window. Similarly, method 500 will turn clock 290 on and return to step 513 if the power level detected at peak detector 245 leaves the power window.

If method 500 is in the rest state because all of attenuators 200, 210, and 230 are at rollover points, then method 500 returns to step 504 if the power level detected at peak detector 240 is outside of the power window and adjusting the attenuation accordingly would not cause rollover in one of attenuators 200 or 210. Similarly, method 500 returns to step 514 if the power level detected at peak detector 245 is outside of the power window and adjusting the attenuation accordingly would not cause rollover in one of attenuators 200, 210 or 230.

Figure 6A:
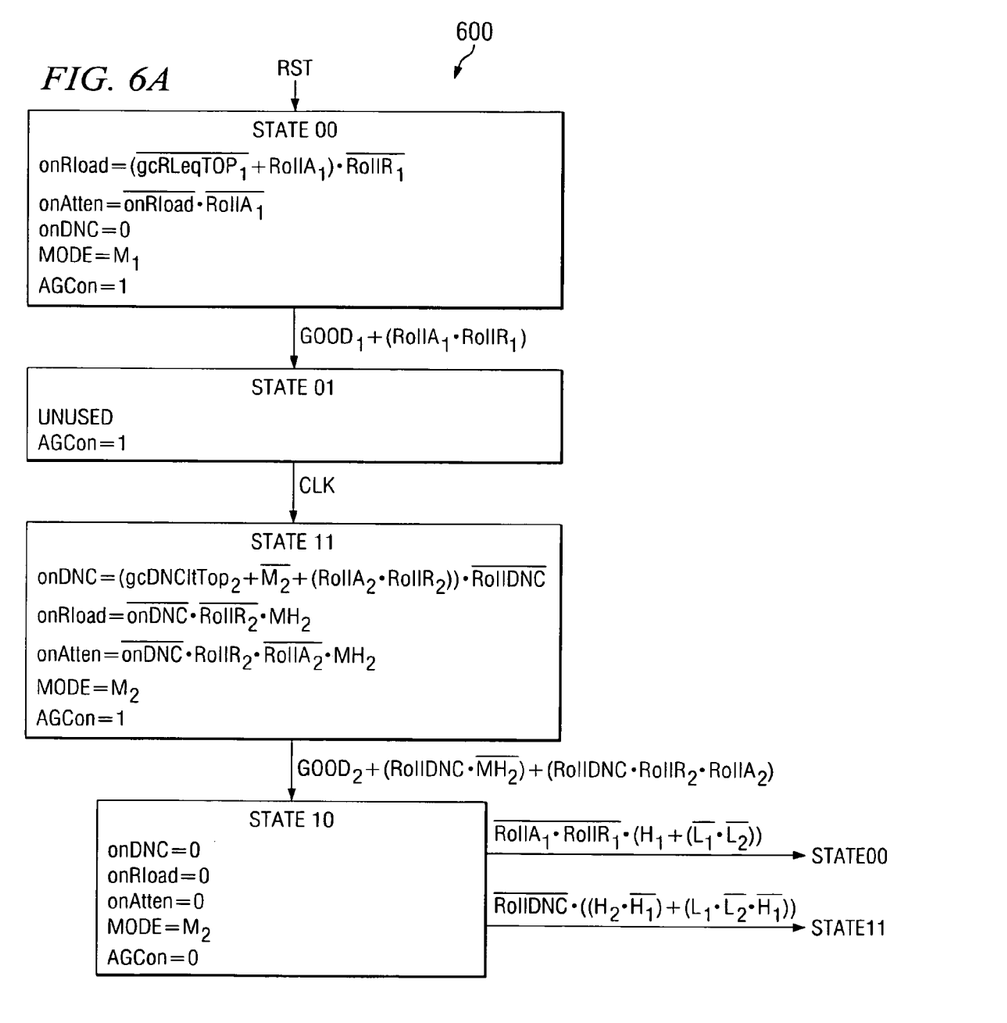
FIGS. 6A and 6B are illustrations of an exemplary method adapted according to one embodiment of the invention.
Figure 6B:
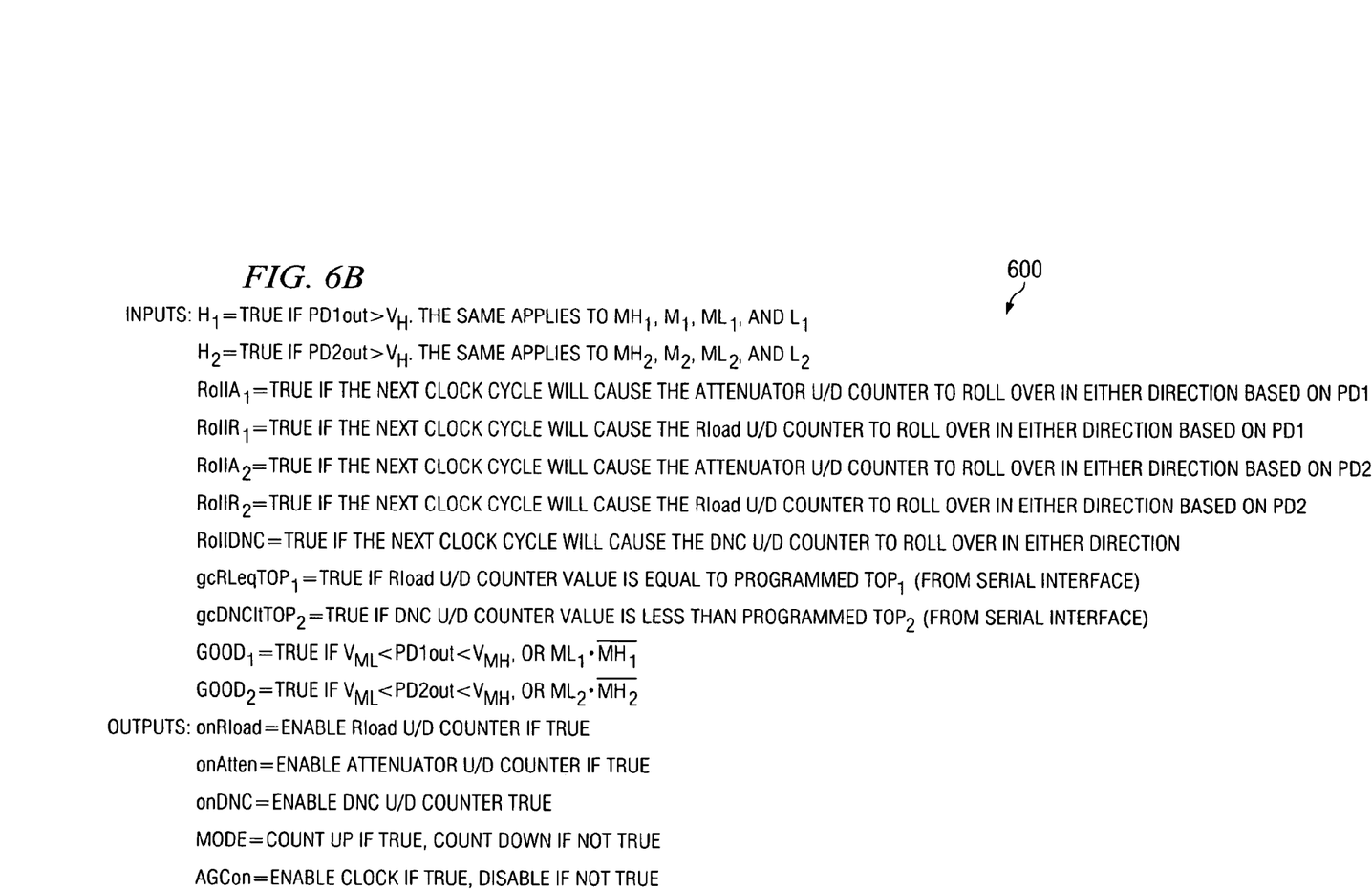

An alternative way to describe the AGC operation of system 299 is to illustrate it as an operation of a state machine executed by AGC control logic 270. FIGS. 6A and 6B are illustrations of exemplary method 600 adapted according to one embodiment of the invention. Equations in FIG. 6B explain the relations and variables of the states in FIG. 6A.

Method 600 starts out at state 00. In state 00, AGC control logic 270 operates to settle the power detected by peak detector 240 in a power window defined by VML and VMH. Method 600 changes from state 00 if the signal power is settled in the window or if both of attenuators 200 and 210 are at rollover point so that adjusting attenuation further is not possible.

Method 600 moves to state 01, which is not used. Accordingly, method 600 advances to state 11. In state 11, AGC control logic 270 operates to settle the power detected by peak detector 245 in a power window defined by VML and VMH. Method 600 changes from state 11 if the signal power detected by peak detector 245 is settled in the window or if all of attenuators 200, 210, and 230 are at rollover point so that adjusting attenuation further is not possible.

Another condition that will cause method 600 to advance from state 11 is when the power level detected by one of detectors 240 or 245 is settled in its respective window and the power detected by the other of detectors 240 or 245 is below its respective window and it is not possible to decrease attenuation further. The state machine does not advance from state 11 when the power level detected by one of detectors 240 or 245 is settled in its respective window and the power detected by the other of detectors 240 or 245 is above its respective window.

Method 600 advances to state 10 from state 11. State 10 is the idle state or rest state, and AGC control logic 270 turns off clock 290. Peak detectors 240 and 245 and comparators 250 and 260 are operating so that AGC control logic 270 monitors signal power level. If the signal power detected by either of peak detectors 240 or 245 falls outside of its respective window, then method 600 advances to either state 00 or state 11 (unless, of course, adjusting attenuation is not possible because attenuators 200, 210, and 230 are at rollover points). It is possible to define a different widow for monitoring at each of detectors 240 and 245 in state 10 than the windows used in states 00 and 11. For instance, it is possible to perform method 600 so that it advances to either of states 00 or 11 when the signal power detected by either of peak detectors 240 or 245 falls outside of VH and VL. Widening the window may increase the time it takes to advance from state 10.

The embodiments illustrated in FIGS. 5 and 6 are merely examples, and other methods of performing AGC according to the invention are possible. For instance, different takeover points for attenuators, different orders for measuring power from peak detectors, different numbers and placements of peak detectors, and the like are all possible. In fact, principles of the invention are applicable in general to broadband tuners and are not limited to any specific technique.

Various embodiments of the invention may include one or more advantages over prior art solutions. For instance, some prior art systems reduce the power from unwanted or unmonitored bands through the use of narrow band filters. In some embodiments of the present invention, though, it is possible to reduce or eliminate the need for narrow band filters in the signal path, since the broadband power detectors (e.g., detector 245 of FIG. 2) allow a control loop to react to total broadband signal power.

Trading narrow band filters for broadband power detectors may provide for smaller, faster, and cheaper systems. For instance, since it can be difficult to create narrow band filters on semiconductor substrates, embodiments that reduce or eliminate the need for such filters can be used in systems that have a higher degree of integration.

Further, designers in the past have been reluctant to use digital attenuators out of a concern that it is difficult to cause an AGC system to settle since attenuation from such filters is in discrete steps, thereby causing some amount of error at each measurement. Various embodiments of the present invention solve the problem by comparing signal power to a reference window of levels rather than to a single reference value. Accordingly, a control system can settle. Further, various embodiments allow the reference window to be set by user input or by an algorithm, so that wider and narrower windows can be tailored for a given application. For instance, in a system wherein it is important to have slower state changes, the window can be widened.

Distributing attenuation throughout a signal path can provide a higher degree of control over that provided by prior art systems. For instance, various prior art systems detect signal power near the end of the signal path and adjust attenuation only near the input. However, the power detected in the signal near the output does not always represent the power near the input to an acceptable degree of accuracy. As a result, prior art systems may experience distortion caused by excessive signal power near the input, especially from bands that are not being demodulated at a given time. However, various embodiments of the present invention detect total broadband signal power at a plurality of points in the signal path and distribute attenuation throughout the signal path, thereby lessening the occurrence of distortion near the input.

Various embodiments of the invention perform attenuation adjustments based on a clock cycle designed to allow for some amount of delay between possible adjustments. The amount of delay can be increased or decreased to allow for the signal and the various circuits in the signal path to reach steady state, while still providing quick response times. Further, various embodiments adjust attenuation in small steps (e.g., 0.05 dB), by, for example, adjusting only one attenuator at a time. Small adjustments at a controlled rate can help a demodulator to remain locked on a signal as attenuation is adjusted.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for providing automatic gain control (AGC), said system comprising:
a signal path with an RF input and a demodulator;
a plurality of power detectors in communication with said signal path, each of said power detectors operable to measure a total broadband power level of a signal in said signal path, each of said power detectors positioned to monitor a point in said signal path corresponding to a change in signal bandwidth, wherein at each of said points said signal includes one or more communication channels in addition to one or more channels processed by said demodulator at a given time;
a plurality of digital attenuators distributed throughout said signal path; and
a control system operable to receive from each of said power detectors information associated with said power level and to adjust one or more of said digital attenuators in said signal path in response to said information to achieve desired gain control, wherein each of said digital attenuators comprises:
a plurality of discrete resistive legs, and wherein the attenuation of a given one of said digital attenuators is determined by a number of said legs that are switched on by said control system.

2. The system of claim 1 wherein said plurality of digital attenuators, said power detectors, and said control system are on a same semiconductor chip.

3. The system of claim 2 wherein said system is included in an RF tuner.

4. The system of claim 1 wherein said control system is operable to adjust each of said digital attenuators, each said attenuator associated with a takeover point attenuation level, said control system operable to adjust a first one of said digital attenuators until a takeover point is reached and thereafter to adjust a second of said digital attenuators until a takeover point is reached and thereafter to adjust said first one of said digital attenuators until a maximum attenuation is reached for said first one of said digital attenuators.

5. The system of claim 4 wherein each attenuator is associated with a counter, said counters outputting binary words to control said attenuators.

6. The system of claim 1 further comprising:
at least one bank of comparators operable to receive output from at least one of said plurality of power detectors and to compare a measured total broadband power level to a range of reference power levels.

7. The system of claim 6 wherein said control system receives said information associated with said power level through said bank of comparators.

8. The system of claim 1 further comprising a clock in communication with said control system, said control system operable to adjust attenuation based on cycles of said clock.

9. A method for providing automatic gain control in an RF signal tuner, said method comprising:
providing a plurality of broadband power detectors in a signal path, each said power detector in communication with said signal path at a point that corresponds to a change in signal bandwidth;
detecting a total broadband power level in a signal at each said power detector, wherein at each of said points said signal includes one or more communication channels in addition to one or more channels processed by a baseband processing circuit at a given time; and
adjusting attenuation in said signal path in response to said detecting, thereby approaching a desired signal power level, wherein adjusting attenuation in said signal path comprises:
associating each of a plurality of digital attenuators distributed in said signal path with a takeover attenuation level; and
adjusting a first one of said digital attenuators to its respective takeover attenuation level before adjusting a second one of said digital attenuators.

10. The method of claim 9 further comprising:
comparing said broadband power level to a power window.

11. The method of claim 10 wherein adjusting attenuation comprises:
increasing attenuation by said first one of said plurality of digital attenuators when said detected broadband power level is above said window; and
decreasing attenuation by said first one of said plurality of digital attenuators when said detected broadband power level is below said window.

12. The method of claim 10 wherein adjusting attenuation comprises:
controlling said at least one of said plurality of digital attenuators with output from a counter.

13. The method of claim 12 further comprising:
incrementing said output from said counter during cycles of a clock, thereby performing said adjusting based on cycles of said clock.

14. The method of claim 13 further comprising:
comparing said detected broadband power level to a power window; and
stopping said clock when said detected broadband power level is within said window.

15. The method of claim 9 wherein said adjusting comprises:
adapting attenuation in said first one of said plurality of digital attenuators until a predetermined attenuation is reached;
adapting attenuation in said second one of said plurality of digital attenuators until another predetermined attenuation is reached; and
adapting attenuation in said first one of said plurality of digital attenuators after said another predetermined attenuation is reached.

16. A system for providing Automatic Gain Control (AGC), said system comprising:
a signal path with a plurality of components that change a bandwidth of a signal on said path before said signal reaches a demodulator;
a plurality of broadband power detectors placed in communication with said signal path, each at a portion corresponding to a bandwidth change of said signal, each said power detector providing information relating to a total power of said signal at its respective portion of said path, wherein at each said portion said signal includes one or more communication channels in addition to one or more channels processed by said demodulator at a given time;
a plurality of adjustable attenuators distributed throughout said signal path; and
a control system in communication with said broadband power detectors and with said attenuators, said control system operable to receive said information and to adjust said plurality of attenuators in response thereto, thereby adjusting attenuation at a plurality of locations in said signal path, wherein each of said attenuators is a digital attenuator with a plurality of discrete resistive legs, and wherein the attenuation of each of said digital attenuators is determined by a number of said legs that are switched on by said control system using one or more digital counters.

17. The system of claim 16 wherein, said control system associates each of said attenuators with a takeover attenuation level, and is operable to adjust each said attenuator to its respective takeover attenuation level and to adjust other of said attenuators before adjusting said each said attenuator above its takeover attenuation level.

18. The system of claim 16 wherein said system is included in a broadband RF signal tuner.

19. The system of claim 16 wherein said system is disposed on a semiconductor ship.

20. A system for providing Automatic Gain Control (AGC), said system comprising:
   a signal path with a plurality of components that change bandwidth of a signal on said path;
   a plurality of adjustable digital attenuators distributed throughout said signal path; and
   a control system in communication with said attenuators, said control system operable to adjust said plurality of digital attenuators to provide Automatic Gain Control (AGC), wherein each of said digital attenuators comprises:
      a plurality of discrete resistive legs, and wherein the attenuation of a given one of said digital attenuators is determined by a number of said legs that are switched on by said control system.

21. The system of claim 20 further comprising:
   a plurality of broadband power detectors placed in communication with said signal path, each at a portion corresponding to a bandwidth change of said signal, each said power detector providing information to said control system relating to a total power of said signal at its respective portion of said path, wherein at each respective portion said signal includes one or more communication channels in addition to one or more channels processed by a baseband processing circuit at a given time.

* * * * *